United States Patent
Ravi et al.

(10) Patent No.: US 9,397,239 B2
(45) Date of Patent: *Jul. 19, 2016

(54) INSITU EPITAXIAL DEPOSITION OF FRONT AND BACK JUNCTIONS IN SINGLE CRYSTAL SILICON SOLAR CELLS

(71) Applicant: Crystal Solar, Inc., Santa Clara, CA (US)

(72) Inventors: Tirunelveli S. Ravi, San Jose, CA (US); Ashish Asthana, Fremont, CA (US)

(73) Assignee: Crystal Solar, Incorporated, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/109,422

(22) Filed: Dec. 17, 2013

(65) Prior Publication Data
US 2014/0182673 A1      Jul. 3, 2014

Related U.S. Application Data

(63) Continuation of application No. 13/424,287, filed on Mar. 19, 2012, now Pat. No. 8,609,451.

(60) Provisional application No. 61/454,363, filed on Mar. 18, 2011.

(51) Int. Cl.
*H01L 31/0224* (2006.01)
*H01L 31/0236* (2006.01)
(Continued)

(52) U.S. Cl.
CPC .... *H01L 31/022433* (2013.01); *H01L 21/0245* (2013.01); *H01L 21/02381* (2013.01);
(Continued)

(58) Field of Classification Search
CPC ............... H01L 31/02167; H01L 31/022441; H01L 31/068; H01L 31/02168; H01L 31/022433; H01L 31/02245; H01L 31/0684; H01L 31/022425; H01L 31/0236; H01L 31/02363; H01L 31/0725
USPC ............... 257/49, 75, 99, 184, 578, E21.04, 257/E21.219, E31.11, E31.127; 136/255, 136/256
See application file for complete search history.

(56) References Cited

U.S. PATENT DOCUMENTS 5,811,348 A     9/1998  Matsushita et al.
6,478,883 B1 *  11/2002 Tamatsuka ............. C30C 15/00
                                                          117/20
(Continued)

FOREIGN PATENT DOCUMENTS

WO   WO2009/071561 A2   6/2009

OTHER PUBLICATIONS

Schmich, E., et al., "*n-Type Emitter Epitaxy for Crystalline Silicon Thin-Film Solar Cells*," Prog. Photovolt: Res. Appl. 2008, vol. 16, pp. 159-170.

(Continued)

*Primary Examiner* — Mohsen Ahmadi
(74) *Attorney, Agent, or Firm* — David H. Jaffer; Pillsbury Winthrop Shaw Pittman LLP

(57) ABSTRACT

Fabrication of a single crystal silicon solar cell with an insitu epitaxially deposited very highly doped p-type silicon back surface field obviates the need for the conventional aluminum screen printing step, thus enabling a thinner silicon solar cell because of no aluminum induced bow in the cell. Furthermore, fabrication of a single crystal silicon solar cell with insitu epitaxial p-n junction formation and very highly doped n-type silicon front surface field completely avoids the conventional dopant diffusion step and one screen printing step, thus enabling a cheaper manufacturing process.

21 Claims, 2 Drawing Sheets

(51) Int. Cl.
 *H01L 31/18* (2006.01)
 *H01L 21/02* (2006.01)
 *H01L 31/068* (2012.01)

(52) U.S. Cl.
 CPC .... *H01L21/02513* (2013.01); *H01L 21/02532* (2013.01); *H01L 21/02664* (2013.01); *H01L 31/02366* (2013.01); *H01L 31/022441* (2013.01); *H01L 31/0684* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 6,559,479 | B1 | 5/2003 | Ludemann |
| 8,030,119 | B2 | 10/2011 | Ravi et al. |
| 8,298,629 | B2 | 10/2012 | Sivaramakrishnan et al. |
| 8,309,844 | B2 | 11/2012 | Merchant et al. |
| 8,481,357 | B2 | 7/2013 | Kumar et al. |
| 8,609,451 | B2 | 12/2013 | Ravi et al. |
| 8,809,097 | B1 | 8/2014 | Ravi et al. |
| 8,883,552 | B2 | 11/2014 | Asthana et al. |
| 2004/0200520 | A1 | 10/2004 | Mulligan et al. |
| 2005/0189015 | A1* | 9/2005 | Rohatgi et al. ............ 136/261 |
| 2005/0252544 | A1 | 11/2005 | Rohatgi et al. |
| 2007/0169808 | A1 | 7/2007 | Kherani et al. |
| 2007/0281439 | A1* | 12/2007 | Bedell ........... H01L 21/76259 438/455 |
| 2009/0007962 | A1 | 1/2009 | Wenham et al. |
| 2009/0056798 | A1 | 3/2009 | Merchant et al. |
| 2009/0188553 | A1 | 7/2009 | Dubin |
| 2009/0227063 | A1* | 9/2009 | Ravi .................. H01L 31/048 438/73 |
| 2010/0015756 | A1 | 1/2010 | Weidman et al. |
| 2010/0029039 | A1 | 2/2010 | Shan et al. |
| 2010/0037942 | A1* | 2/2010 | Borland et al. ............. 136/255 |
| 2010/0108130 | A1 | 5/2010 | Ravi |
| 2010/0108134 | A1 | 5/2010 | Ravi |
| 2010/0178766 | A1 | 7/2010 | Andry et al. |
| 2010/0240169 | A1 | 9/2010 | Petti et al. |
| 2010/0263587 | A1 | 10/2010 | Sivaramakrishnan et al. |
| 2011/0005582 | A1 | 1/2011 | Szlufcik et al. |
| 2011/0041911 | A1 | 2/2011 | Lee et al. |
| 2011/0048531 | A1* | 3/2011 | Lee et al. ................... 136/256 |
| 2011/0056532 | A1* | 3/2011 | Ravi ................ H01L 31/0682 136/244 |
| 2011/0073176 | A1 | 3/2011 | Kim |
| 2012/0000511 | A1 | 1/2012 | Gee et al. |
| 2012/0040487 | A1 | 2/2012 | Asthana et al. |
| 2012/0048376 | A1 | 3/2012 | Gilman |
| 2012/0152341 | A1* | 6/2012 | Li et al. ..................... 136/256 |

OTHER PUBLICATIONS

Kerschaver et al., "*Back-contact Solar Cells: A Review*," Progress in Photovoltaics: Research and Applications; 2006, vol. 14, pp. 107-123.

International Search Report and Written Opinion Issued Jul. 16, 2012 for International PCT Application No. PCT/US2012/029708.

* cited by examiner

INSITU EPITAXIAL DEPOSITION OF FRONT AND BACK JUNCTIONS IN SINGLE CRYSTAL SILICON SOLAR CELLS

CROSS-REFERENCE TO RELATED APPLICATIONS

This application is a continuation of U.S. patent application Ser. No. 13/424,287 filed Mar. 19, 2012, which claims the benefit of U.S. Provisional Application Ser. No. 61/454,363 filed Mar. 18, 2011, both incorporated by reference in their entirety herein.

FIELD OF THE INVENTION

The present invention relates generally to solar cells, and more particularly to methods for epitaxially depositing single crystal silicon solar cells including epitaxially deposited front and back junctions.

BACKGROUND

There is a lower limit to the thickness of single crystal silicon solar cells manufactured with an aluminum back surface field (BSF), since the Al BSF fabrication process, which involves screen printing an Al paste, induces a bow in thin silicon wafers when the Al paste is fired. For 200 micron thick wafers bow starts to affect solar cell yield, and for wafers of 150 microns and less wafer bow becomes a yield killer for solar cell fabrication. The Al paste shrinks during firing causing the wafer to bow such that the Al covered surface becomes convex. This wafer bow may result in wafer breakage during subsequent processing, particularly during tabbing and stringing, and this is becoming a greater concern, as the solar industry migrates to larger wafers, from 125 mm to 156 mm square (or pseudosquare) wafers, for example,. There is a need for a manufacturable alternative to an Al BSF for making thinner single crystal silicon solar cells.

The front-side p-n junction in single crystal silicon solar cells is currently manufactured using a diffusion process, which also requires a post-diffusion clean. There is a need for a more efficient manufacturing process which avoids front side diffusion and clean.

SUMMARY OF THE INVENTION

A single crystal silicon solar cell with an insitu epitaxially deposited $p^{++}$ silicon BSF (for a p-base cell) will obviate the need for the conventional Al screen printing step, thus enabling a thinner silicon solar cell because of no Al induced bow in the cell. Here the term $p^{++}$ is used to refer to very highly p-doped silicon where the dopant concentration is greater than $1 \times 10^{18}$ cm$^{-3}$ and the resistivity is less than or equal to 20 mohm-cm. This invention is applicable to both n-and p-base silicon solar cells.

Furthermore, a single crystal silicon solar cell with insitu epitaxial p-n junction formation and $n^{++}$ front surface field (FSF) completely avoids the conventional dopant diffusion step and one screen printing step, thus enabling a cheaper manufacturing process. Here the term $n^{++}$ is used to refer to very highly n-doped silicon—with dopant concentration of greater than $1 \times 10^{18}$ cm$^{-3}$, where the resistivity may be less than or equal to 20 mohm-cm. This invention is applicable to both n- and p-base silicon solar cells.

According to aspects of the invention, a method of fabricating a thin epitaxial silicon solar cell may comprise: depositing an epitaxial film of highly doped p-type silicon on a porous silicon layer on a silicon wafer, the highly doped p-type silicon film having a resistivity of less than 20 mohm-cm, the highly doped p-type silicon film being a back surface field (BSF) layer; depositing an epitaxial film of p-type silicon on the BSF, the p-type silicon film being a base layer; exfoliating the BSF and the base from the silicon wafer; forming an emitter layer at the surface of the base layer; forming front contacts to the emitter layer on the front surface of the cell; and forming back contacts to the BSF on the back surface of the cell, the back contacts being patterned to cover less than fifty percent of the back surface of the cell. Furthermore, the front and back contact grids may be made of the same metal, may have the same dimensions and/or may be aligned front-to-back.

According to further aspects of the invention, a method of fabricating a thin epitaxial silicon solar cell may comprise: depositing an epitaxial film of highly doped p-type silicon on a porous silicon layer on a silicon wafer, the highly doped p-type silicon film having a resistivity of less than 20 mohm-cm, the highly doped p-type silicon film being an emitter layer; depositing an epitaxial film of n-type silicon on the emitter layer, the n-type silicon film being a base layer; depositing an epitaxial film of highly doped n-type silicon on the base layer, the highly doped n-type silicon film having a dopant density of greater than $1 \times 10^{18}$ cm$^{-3}$, the highly doped n-type silicon film being a front surface field (FSF) layer; exfoliating the emitter, the base and the FSF from the silicon wafer; forming front contacts to the FSF layer on the front surface of the cell; and forming back contacts to the emitter on the back surface of the cell, the back contacts being patterned to cover less than fifty percent of the back surface of the cell. Furthermore, the front and back contact grids may be made of the same metal, may have the same dimensions and/or may be aligned front-to-back.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
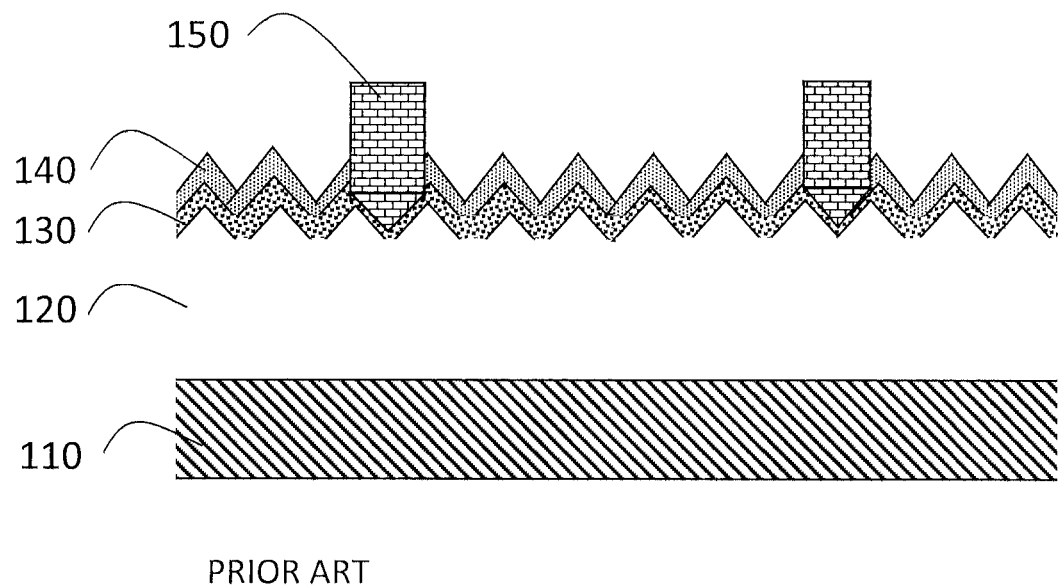
FIG. 1 is a cross-sectional view of a representation of a conventional silicon solar cell.

FIG. 1 shows a conventional solar cell with a screen-printed aluminum back contact prior art silicon solar cell. The cell of FIG. 1 comprises an aluminum BSF and back contact 110, a p-type base 120, a diffusion doped $n^+$ emitter 130, an anti-reflection coating 140 and a silver front contact grid 150. The front surface was texture etched prior to forming the emitter.

Figure 2:
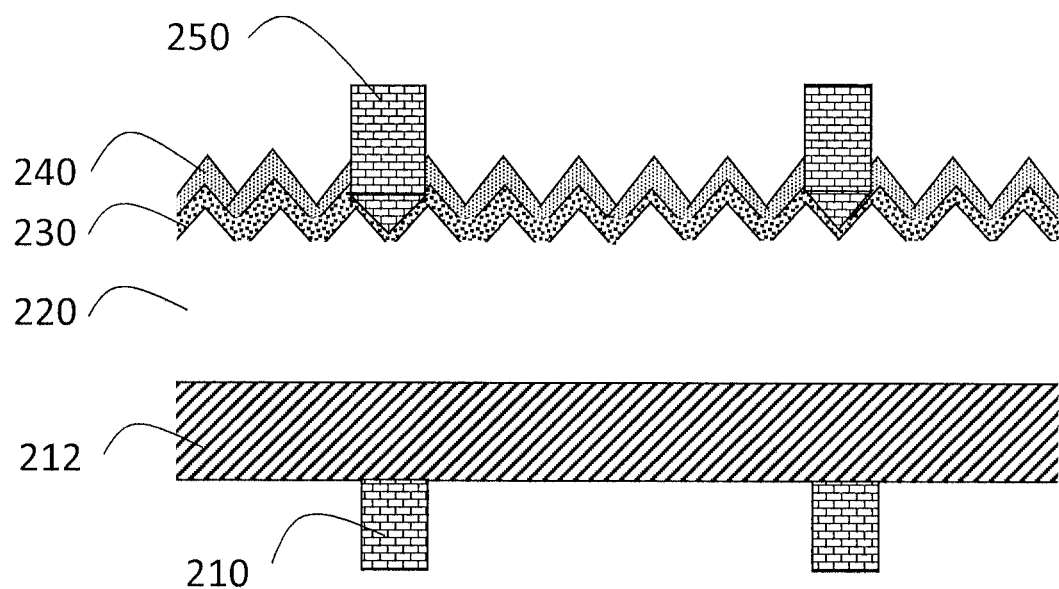
FIG. 2 is a cross-sectional view of a representation of an epitaxial solar cell, according to some embodiments of the present invention.

FIG. 2 shows a thin epitaxial solar cell with a $p^{++}$ in-situ back contact, according to the present invention. FIG. 2 shows a silicon solar cell comprising a back contact grid 210, a $p^{++}$ BSF 212, a p-type base 220, a diffusion doped $n^+$ emitter 230, an anti-reflection coating 240 and silver front contact grid 250. The front surface was texture etched prior to forming the emitter. For ease of comparison, FIG. 2 is shown below FIG. 1 which shows a conventional solar cell with a screen-printed aluminum back contact. Furthermore, due to the high conductivity of the $p^{++}$ layer, the back contacts of FIG. 2 may be patterned to cover less than fifty percent of the back surface of said cell, and preferably less than ten percent. The back contacts may be formed as a grid, for example, rather than a continuous layer, the latter being required in the conventional cell of FIG. 1. Yet furthermore, the contacts on the front and back surfaces of FIG. 2 may be formed as matching grids and may also be formed of the same material—Ag, for example—resulting in little if any bow in the wafer. Matching grids may be grids that have the same line widths, heights and spacings and the same surface coverage; furthermore, matching grids may also be aligned front to back as shown in FIG. 2.

An embodiment of a process flow according to the present invention for a less than 200 micron thick bifacial solar cell, such as shown in FIG. 2 includes the following steps:
1. form a porous silicon layer on a silicon substrate by anodic etching in an HF-based solution;
2. anneal the porous silicon layer in $H_2$ gas in an epitaxial deposition reactor;
3. deposit an epitaxial film of $p^{++}$ silicon BSF (resistivity of 1-20 mohm-cm, and preferably 1-10 mohm-cm) on the annealed surface of the porous silicon, approximately 1-10 microns thick, in the epitaxial deposition reactor;
4. deposit an epitaxial film of p-type silicon (0.5-2 ohm-cm resistivity) on the BSF, approximately 40-200 microns thick, in the epitaxial deposition reactor;
5. exfoliate the epitaxial silicon cell structure from the silicon substrate and reclaim and reuse the silicon substrate (this works for cells as thin as 80-90 microns which can be processed free standing; thinner cells require support such as a handle and/or may continue some of the front side processing prior to exfoliation—see, for example U.S. Provisional Patent Appl. No. 61/514,641, incorporated by reference herein);
6. further processing steps for the exfoliated silicon cell structure include:
    a. texture etch the front side, that is the surface of the p-type silicon layer, using well known processes, using solutions containing potassium hydroxide (KOH) and isopropyl alcohol (IPA), for example;
    b. diffuse an n-type dopant into the texture etched surface to form a p-n junction;
    c. deposit a 70-90 nm thick $SiN_x$ film on the doped textured surface using a plasma-enhanced chemical vapor deposition (PECVD) or by reactive sputtering—the silicon nitride layer acts as an anti-reflection coating (ARC) and preferably has a refractive index close to 2 to give good anti-reflection performance;
    d. form on the front side a Ag grid with a busbar using screen printing of Ag paste followed by drying the paste (front side grids are formed so as to cover the minimum of the front surface of the solar cell and yet provide an effective electrical contact to the emitter); and
    e. form on the back side a Ag or Ag/Al grid with a busbar, using screen printing of metal paste followed by firing at 800 to 1,000 degrees C.—the front and back metallizations are co-fired.

Crystal Solar's epitaxial reactor, as described in U.S. Patent Application Publications Nos. 2010/0215872 and 2010/0263587, both incorporated by reference herein, provides a low cost, high throughput means for epitaxial silicon deposition which can be utilized for the above epitaxial deposition steps. The above process may also readily be adapted to make an n-base cell. Furthermore, variations on the above process flow may include alternative materials and deposition methods for the front side and back side electrical contacts. The porous silicon layer may have modulated porosity, with a lower porosity at the surface. Further variations are discussed in U.S. Patent Application Publication No. 2012/0040487 and U.S. patent application Ser. No. 13/241,112, both incorporated by reference herein. Yet further variations will be apparent to those skilled in the art after reading the disclosure of the present invention.

The epitaxial solar cell design of the present invention, as shown in FIG. 2, is important since it completely avoids the Al screen printing step, instead using a $p^{++}$ layer in the back of the cell to allow ohmic contact to the Ag or Ag/Al grid. The epitaxial cell of the present invention may include the following advantages over a conventional cell: lower cell manufacturing cost since Al screen printing is avoided; thinner silicon (below 200 microns, and particularly below 150 microns) is enabled because Al back contact induced bow is avoided; the epitaxial cell of the present invention can be used as a bifacial cell with double glass, such as described in U.S. Patent Application Publication No. 2011/0056532 and U.S. Provisional Patent Application No. 61/514,641, both incorporated by reference herein; and the performance of a cell with an epitaxial silicon BSF is expected to be improved over a cell with an Al screen printed BSF—the former being expected to have a higher open circuit voltage, $V_{oc}$.

Figure 3:
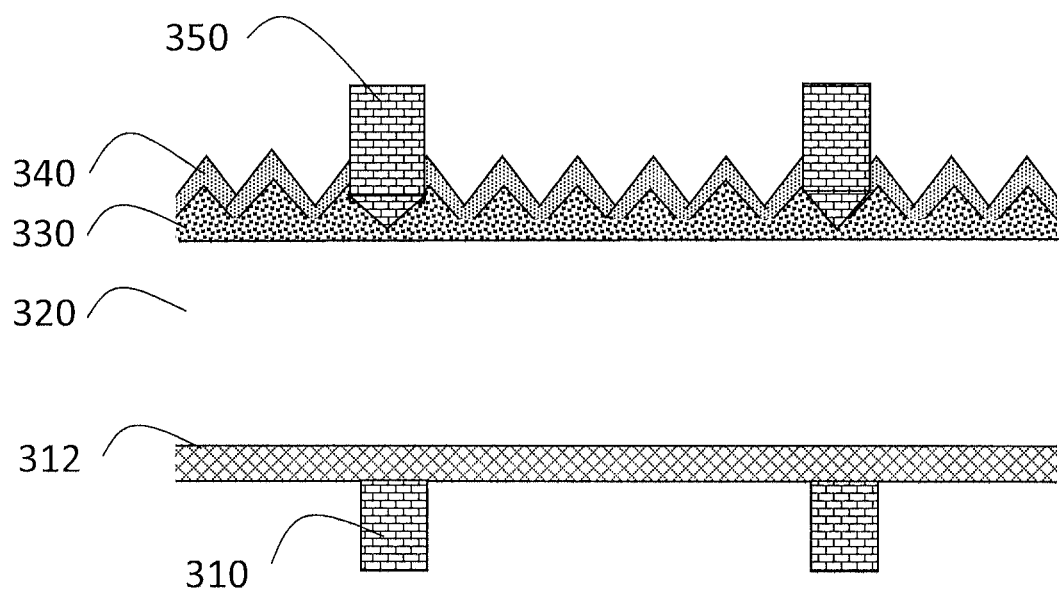
FIG. 3 is a cross-sectional view of a representation of a further embodiment of an epitaxial silicon solar cell according to the present invention.

FIG. 3 shows a schematic representation of a thin single crystal silicon solar cell with a $p^{++}$ silicon emitter and an epitaxial $n^{++}$ FSF layer, according to the present invention. FIG. 3 shows a silicon solar cell comprising a back contact grid 310, a $p^{++}$ emitter 312, an n-type base 320, an epitaxially deposited $n^{++}$ FSF 330, an anti-reflection coating 340 and silver front contact grid 350. The front surface was texture etched after depositing the FSF. Furthermore, due to the high conductivity of the $p^{++}$ layer, the back contacts of FIG. 3 may be patterned to cover less than fifty percent of the back surface of said cell, and preferably less than ten percent. The back contacts may be formed as a grid, for example, rather than a continuous layer, the latter being required in the conventional cell of FIG. 1. Yet furthermore, the contacts on the front and back surfaces of FIG. 3 may be formed as matching grids and may also be formed of the same material—Ag, for example— resulting in little if any bow in the wafer. Matching grids may be grids that have the same line widths, heights and spacings and the same surface coverage; furthermore, matching grids may also be aligned front to back as shown in FIG. 3.

An embodiment of a process flow according to the present invention for a less than 200 micron thin bifacial solar cell, such as shown in FIG. 3 includes the following steps:
1. form a porous silicon layer on a silicon substrate by anodic etching in an HF-based solution;
2. anneal the porous silicon layer in $H_2$ gas in an epitaxial deposition reactor;
3. deposit an epitaxial film of $p^{++}$ silicon emitter (resistivity of 1-20 mohm-cm, and preferably 1-10 mohm-cm) on the annealed surface of the porous silicon, approximately 0.5 microns or less in thickness, in the epitaxial deposition reactor;
4. deposit an epitaxial film of n-type silicon (0.5-2 ohm-cm resistivity) on the emitter, approximately 50-200 microns thick, in the epitaxial deposition reactor;
5. deposit an epitaxial film of $n^{++}$ silicon FSF (with dopant density of greater than $1\times10^{18}$ $cm^{-3}$, which may provide a resistivity in the range of 1-20 mohm-cm, and preferably 1-10 mohm-cm) on the n-type silicon layer, approximately 10-20 microns thick;
6. exfoliate the epitaxial silicon cell structure from the silicon substrate and reclaim and reuse the silicon substrate (this works for cells as thin as 80-90 microns which can be processed free standing; thinner cells require support such as a handle and/or may continue some of the front side processing prior to exfoliation—see, for example U.S. Provisional Patent Appl. No. 61/514,641, incorporated by reference herein);
7. further processing steps for the exfoliated silicon cell structure include:
   a. texture etch the front side, that is the surface of the $n^{++}$ FSF (with $p^{++}$ junction protected), using well known processes, using solutions containing potassium hydroxide (KOH) and isopropyl alcohol (IPA), for example;
   b. deposit a 70-90 nm thick $SiN_x$ film on the textured surface using a plasma-enhanced chemical vapor deposition (PECVD) or by reactive sputtering—the silicon nitride layer acts as an anti-reflection coating (ARC) and preferably has a refractive index close to 2 to give good anti-reflection performance;
   c. form on the front side a Ag grid with a busbar using screen printing of Ag paste followed by drying the paste (front side grids are formed so as to cover the minimum of the front surface of the solar cell and yet provide an effective electrical contact to the FSF); and
   d. form on the back side a Ag or Ag/Al grid with a busbar, using screen printing of metal paste followed by firing at 800-1,000 degrees C.—the front and back metallizations are co-fired.

Crystal Solar's epitaxial reactor, as described in U.S. Patent Application Publications Nos. 2010/0215872 and 2010/0263587, both incorporated by reference herein, provides a low cost, high throughput means for epitaxial silicon deposition which can be utilized for the above epitaxial deposition steps.

The epitaxial solar cell design of the present invention, as shown in FIG. 3, is important since: complete front and back junction formation in epitaxial silicon completely avoids the diffusion process and post diffusion cleans, hence has much lower cost; these cells are high efficiency n-type cells; and these cells may be made with less than 150 microns thickness, due to having no Al back contact—see discussion above with respect to the cell structure of FIG. 2.

Further details of fabrication methods for epitaxial silicon solar cells are provided in U.S. Pat. No. 8,030,119, US Patent Application Publications Nos. 2010/0108134, 2010/0108130, 2011/0056532 and 2012/0040487 and U.S. patent application Ser. No. 13/241,112 for example, all of which are incorporated by reference.

Although methods of the present invention have been described with the monocrystalline silicon wafer of thickness less than 200 microns (preferably 100-140 microns) being formed by epitaxial deposition on a porous silicon layer on the surface of a silicon substrate followed by exfoliation, where the porous silicon layer acts as a fracture layer, other methods of forming the monocrystalline silicon wafer may be used. For example, the less than 200 micron silicon substrates may be formed by exfoliation from a silicon substrate where proton implantation to a desired depth followed by annealing at a suitable temperature can be used to exfoliate the thin silicon substrate. Furthermore, thin silicon substrates may be formed by mechanical sawing and or polishing of a silicon substrate or boule.

Although methods of the present invention have been described with the $p^{++}$ BSF being formed by epitaxial deposition, other methods for forming the BSF may be used. For example, the BSF may be formed by ion implantation of boron or by diffusion of boron into the back surface of the wafer (such as by exposing the back side of the wafer to $BBr_3$ or $BCl_3$ at a high temperature in a diffusion furnace).

Although methods of the present invention have been described with front and back contact grids formed by depositing metal paste and firing, the front and/or back contact grids may also be formed by other techniques including electroplating of metals and alloys, such as copper (using a suitable barrier metallurgy such as Ni followed by copper plate-up).

Furthermore, these alternative fabrication methods may be combined together to form solar cells such as those of FIGS. 2 & 3. For example, a thin silicon substrate formed by mechanical sawing may have a BSF formed on the back surface by ion implantation of boron, front side processing as per the description for FIG. 2 given above, and the front and back metal contact grids may be formed by electroplating of copper to fabricate the solar cell of FIG. 2.

The solar cells described herein are silicon-based solar cells, and the teaching and principles of the present invention apply to solar cells comprising single crystal silicon, multicrystalline silicon, and silicon heterojunctions.

Although the present invention has been particularly described with reference to certain embodiments thereof, it should be readily apparent to those of ordinary skill in the art that changes and modifications in the form and details may be made without departing from the spirit and scope of the invention.

What is claimed is:
1. A thin epitaxial silicon solar cell comprising:
   an epitaxial film of highly doped p-type silicon, said highly doped p-type silicon epitaxial film having a resistivity of less than 10 mohm-cm, said highly doped p-type silicon epitaxial film being a back surface field (BSF) layer;
   an epitaxial film of p-type silicon on said BSF layer, said p-type silicon epitaxial film being a base layer;
   an emitter layer at the surface of said base layer;
   front contacts to said emitter layer on the front surface of said thin epitaxial silicon solar cell; and
   back contacts to said BSF layer on the back surface of said thin epitaxial silicon solar cell, said back contacts being patterned to cover less than fifty percent of the back surface of said thin epitaxial silicon solar cell;

wherein said thin epitaxial silicon solar cell is less than 150 microns thick and wherein said thin epitaxial silicon solar cell is bifacial.

2. The thin epitaxial silicon solar cell of claim 1, wherein said back contacts cover less than ten percent of the back surface of said thin epitaxial silicon solar cell.

3. The thin epitaxial silicon solar cell of claim 1, wherein said front contacts and said back contacts are formed of the same metal.

4. The thin epitaxial silicon solar cell of claim 3, wherein said metal comprises silver.

5. The thin epitaxial silicon solar cell of claim 1, wherein said front contacts and said back contacts are patterned as grids.

6. The thin epitaxial silicon solar cell of claim 5, wherein the front contact grid and the back contact grid have the same dimensions.

7. The thin epitaxial silicon solar cell of claim 6, wherein the front contact grid and the back contact grid are aligned front-to-back.

8. The thin epitaxial silicon solar cell of claim 1, wherein the surface of said base layer is texture etched.

9. The thin epitaxial silicon solar cell of claim 1, wherein said emitter layer is diffusion doped with an n-type dopant.

10. The thin epitaxial silicon solar cell of claim 1, wherein said thin epitaxial silicon solar cell is a single crystal epitaxial silicon solar cell.

11. A thin epitaxial silicon solar cell comprising:
an epitaxial film of highly doped p-type silicon, said highly doped p-type silicon epitaxial film having a resistivity of less than 10 mohm-cm, said highly doped p-type silicon film being an emitter layer;
an epitaxial film of n-type silicon on said emitter layer, said n-type silicon epitaxial film being a base layer;
an epitaxial film of highly doped n-type silicon on said base layer, said highly doped n-type silicon epitaxial film having a a resistivity of less than 10 mohm-cm, said highly doped n-type silicon epitaxial film being a front surface field (FSF) layer;
front contacts to said FSF layer on the front surface of said thin epitaxial silicon solar cell; and
back contacts to said emitter layer on the back surface of said thin epitaxial silicon solar cell, said back contacts being patterned to cover less than fifty percent of the back surface of said thin epitaxial silicon solar cell;
wherein said thin epitaxial silicon solar cell is less than 150 microns thick and wherein said thin epitaxial silicon solar cell is bifacial.

12. The thin epitaxial silicon solar cell of claim 11, wherein said back contacts cover less than ten percent of the back surface of said thin epitaxial silicon solar cell.

13. The thin epitaxial silicon solar cell of claim 11, wherein said front contacts and said back contacts are formed of the same metal.

14. The thin epitaxial silicon solar cell of claim 13, wherein said metal comprises silver.

15. The thin epitaxial silicon solar cell of claim 11, wherein said front contacts and said back contacts are patterned as grids.

16. The thin epitaxial silicon solar cell of claim 15, wherein the front contact grid and the back contact grid have the same dimensions .

17. The thin epitaxial silicon solar cell of claim 16, wherein the front contact grid and the back contact grid are aligned front-to-back.

18. The thin epitaxial silicon solar cell of claim 11, wherein the surface of said FSF layer is texture etched.

19. The thin epitaxial silicon solar cell of claim 18, further comprising an anti-reflection coating on said FSF layer.

20. A thin epitaxial silicon solar cell comprising:
a first epitaxial film, said first epitaxial film being a highly doped p-type silicon film having a resistivity of less than 10 mohm-cm;
a second epitaxial film on said first epitaxial film, said second epitaxial film being a first doped silicon film, said first doped silicon film being a base layer;
a third epitaxial film on said second epitaxial film, said third epitaxial film being a second doped silicon film;
front contacts to said second doped silicon film on a front surface of said thin epitaxial silicon solar cell; and
back contacts to said highly doped p-type silicon film on a back surface of said thin epitaxial silicon solar cell, said back contacts being patterned to cover less than fifty percent of said back surface of said thin epitaxial silicon solar cell;
wherein said thin epitaxial silicon solar cell is less than 150 microns thick and wherein said thin epitaxial silicon solar cell is bifacial.

21. The thin epitaxial silicon solar cell of claim 20, wherein said thin epitaxial silicon solar cell is a single crystal epitaxial silicon solar cell.

* * * * *